United States Patent [19]

Shaham et al.

[11] Patent Number: 4,740,700
[45] Date of Patent: Apr. 26, 1988

[54] THERMALLY INSULATIVE AND ELECTRICALLY CONDUCTIVE INTERCONNECT AND PROCESS FOR MAKING SAME

[75] Inventors: Yifal J. Shaham; Michael Y. Pines, both of Los Angeles; N. John Koda, Vista; Daniel F. Murphy, Carlsbad, all of Calif.

[73] Assignee: Hughes Aircraft Company, Los Angeles, Calif.

[21] Appl. No.: 902,733

[22] Filed: Sep. 2, 1986

[51] Int. Cl.$^4$ .................. H01L 25/00; G01J 1/00; B44C 1/22; B29C 37/00
[52] U.S. Cl. .................. 250/332; 156/633; 156/643; 156/651; 156/656; 156/659.1; 156/668; 156/902; 250/338; 250/349; 437/3; 437/180
[58] Field of Search .......... 156/629, 633, 643, 646, 156/647, 649, 651, 652, 655, 656, 659.1, 668, 901, 902; 29/572, 874, 876, 573; 357/29, 30, 68, 69, 80; 174/68.5; 136/256; 361/381, 386, 388, 395; 250/332, 338, 349; 437/3, 180, 209

[56] References Cited

U.S. PATENT DOCUMENTS

| | | | |
|---|---|---|---|
| 4,072,863 | 2/1978 | Roundy | 250/332 |
| 4,290,844 | 9/1981 | Rotolante et al. | 156/630 |
| 4,354,109 | 10/1982 | White et al. | 250/349 |
| 4,400,868 | 8/1983 | Antypas et al. | 29/572 |
| 4,416,054 | 11/1983 | Thomas et al. | 29/572 |
| 4,532,424 | 7/1985 | Cheung | 250/338 |
| 4,616,403 | 10/1986 | Schulte et al. | 29/572 |

FOREIGN PATENT DOCUMENTS 0071664 2/1983 European Pat. Off. .

*Primary Examiner*—William A. Powell
*Attorney, Agent, or Firm*—Lewis B. Sternfels; A. W. Karambelas

[57] ABSTRACT

A pyroelectric focal plane array useful for thermal imaging applications comprises a detector (10), comprises a reticulated and aluminized pyroelectric chip (12) interfaced with a signal processor chip (14) by thermally insulating bumps (30) coated with a thin conductive layer (38) to form a plurality of thermally insulative and electronically conductive interconnections (16) between detector chips (12) and processor chip (14).

27 Claims, 3 Drawing Sheets

THERMALLY INSULATIVE AND ELECTRICALLY CONDUCTIVE INTERCONNECT AND PROCESS FOR MAKING SAME

BACKGROUND OF THE INVENTION

The present invention relates to an interconnection construction and a process for its application for both electrically connecting and thermally insulating adjacent electrical devices.

Many electrical assemblies require that two or more elements be both electrically connected and thermally insulated, one from the other, to prevent heat generated in one portion from being transmitted to another electrically connected portion, or vice-versa. For example, one portion may be heat sensitive, where its operation is temperature dependent, that is, a change in its temperature will adversely affect its operation. A specific example is a pyroelectric detector whose signals are coupled electrically to a readout circuit for processing the signals. A typical construction comprises a pyroelectric detector focal plane array hybrid which is mounted on an integrated circuit and which generates heat to comprise a large thermal mass. Because the signal generated by a pyroelectric detector is proportional to its time rate of temperature change, any heat transmitted thereto will degrade the detector signal.

It has been conventional practice to cool infrared detectors, such as by cryogenic means. While such cooling is effective, it adds apparatus, weight, and cost to and servicing of the entire electronic assembly. Where the need is to economize on weight, space and cost, other alternatives must be sought. The operation of a pyroelectric solid state array detector without cooling has particular importance in thermal imaging sights.

Present systems, using a photoconductive mercury-cadmium-teluride as the detector, employs either a sterling compressor or a JT crystal with bottle for cooling the detector to 77° K, which weighs approximately 5 pounds and, in the compressor, greater than 20 watts of power is required. Other requirements for transportable systems, weighing approximately 5 pounds, are being considered to obtain thermo-electric cooling to 185° K for operation at 300° K with the weight of 5 to 6 pounds, to enable the systems to be carried by an individual.

Thus, conventional thermal imaging systems which need to be transportable, such as for battlefield uses or fire prevention, are expensive, bulky, and their photoconductive detectors require cryogenic cooling. These imaging systems, therefore, must be permanently installed on a large vehicle, such as a tank or an aircraft. They are difficult to maintain in the field, and create large logistical problems because their cooling bottles containing liquid nitrogen must be frequently replaced. Despite, these drawbacks, thermal imaging systems have proven to be excellent surveillance sensors and have the added advantage of being able to provide night vision by means of passive detection. Having staring pyroelectric systems, which do not need cooling or scanning, will eliminate most of the complexity and cost while retaining their performance, i.e., in resolution and sensitivity. Therefore, it is very desirable to have systems employing uncooled pyroelectric detector arrays.

SUMMARY OF THE INVENTION

The present invention overcomes these and other problems, and attains the desired result by coupling a detector, or other heat-sensitive device, to a heatproducing device, such as a signal processor, by one or more thermally insulating and electrically conductive interconnections. The present invention also relates to the method or process for fabricating such interconnections.

Specifically, a pyroelectric solid state array detector is interconnected to a signal processor readout chip by insulating bumps, preferably in a shape of truncated pyramids, with a thin layer, e.g., 1000 to 2000 Angstroms thick, of metal extending over one sloping side of the pyramid.

The process for producing such an interconnection essentially comprises the steps of forming thermally and electrically insulative material on electric contacts, preferably of the readout circuit, adhering an electrically conductive interconnect to the insulative material, and electrically coupling portions of the interconnect to the contact on the circuit and to contacts on the detector.

Various advantages are obtained from this construction. The interconnection between the detector and the readout circuit has low thermal conductivity to prevent attenuation of the heat signal by cooling of the detector or, conversely, generating spurious noise by heating of the detectors by the circuit, thereby to maintain the sensitivity of the detectors. While maintaining this thermal insulation, high electrical conductivity, through electrical signal leads from the detector elements to the input of the readout, is obtained. Special and expensive cooling, such as by cryogenic equipment, is avoided and, additionally, the need for replacement and servicing is also avoided. Such simplification reduces weight and, therefore, enhances the portability of the detecting and sensing equipment.

Other aims and advantages as well as a more complete understanding of the present invention will appear from the following explanation of exemplary embodiments and the accompanying drawings thereof.

DETAILED DESCRIPTION OF THE INVENTION

Figure 1:
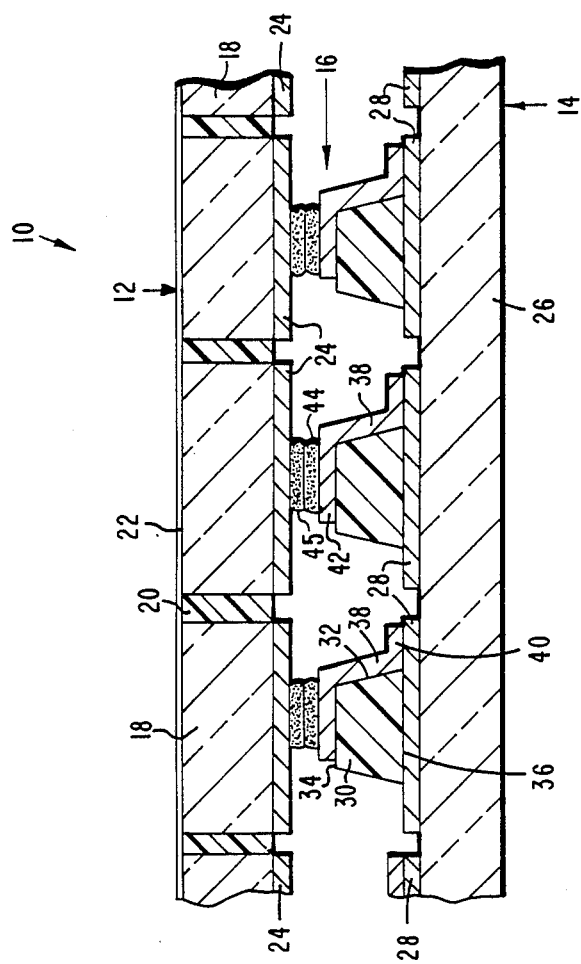
FIG. 1 is a cross-sectional view in elevation depicting the interconnection between a pyroelectric detector and a readout circuit by thermally insulative and electrically conductive interconnections arranged in accordance with the teachings of the present invention.

As shown in FIG. 1, a pyroelectric solid state array detector 10 includes a pyroelectric detector 12 coupled to a readout circuit or signal processor chip 14 by a plurality of thermally insulative and electrically conductive interconnections 16. Detector 12 comprises a plurality of reticulated chips 18 bonded together by a suitable polymeric material 20 to prevent thermal diffusion between chips 18. A thin chromium layer of 200–400 Angstroms, for example, thickness is deposited atop chips 18 to provide a common electrode and a thin film absorber in the 8–12 micrometers spectral range. Aluminum contacts 24 are secured to and terminate the individual chips on their opposite side and are reticulated as the electrodes for the chips. Reticulation of the detector material may be accomplished in any suitable manner, the preferred method being by laser scribing to form cuts at lengths of 5 μm in width and 20-30 μm in depth.

The detector chips may be formed from any suitable pyroelectric material, with a preferred material being potassium tantalate niobate (KTN).

Readout circuit 14 comprises a conventional signal processor chip construction, such as a silicon substrate 26 for x-y addressed readout on a charge coupled device readout in x and y axes. Readout circuit 14 is terminated by a plurality of contacts or pads 28, such as of aluminum.

Interconnections 16 include thermally and electrically insulating bumps 30 of a suitable insulating material, such as a polymer, e.g., of polyimide. While sloping of bumps 30 is not required for purposes of insulation, the sides of the polymer bumps are sloped to form sloped sides 32 so that they have the configuration of a four-sided truncated pyramid with a top surface 34 which is smaller than its bottom surface 36. The sloping of a side 32 between its top and bottom surfaces 34 and 36 is desired to enhance the application and coverage of top surface 34 and a side 32 by a metallic contact 38, the sloping enabling reliable metal coverage on bump 30. Metal contact 38 has one portion 40 which defines an electrical coupling to one aluminum input pad 28 of circuit 14. Another portion 42 of contact 38 is adhered to top surface 34 of bump 30. A connection between portion 42 and aluminum contact 24 of detector chip 18 is effected by a conductive bonding material 44-45, preferably of indium. Preferably, the indium material is applied respectively to contact portions 42 and contact 24 to form separate deposits 44 and 45 so that, when detector 12 is positioned for assembly with readout circuit 14, indium materials 44 and 45 engage to form a secure electrical contact.

Typical dimensions of the polymer bumps in interconnections 16 are 20×20×5 μm for a 3×3 mil unit cell and 12×12×5 μm for a 2×2 mil unit cell. In both cases the remaining dimensions are 1000 Angstroms of both titanium and nickel for metal contact 38, and 3 μm thick of indium for both bonds 44 and 45. The spacing between detector 12 and circuit 14 is approximately 5 μm.

Reference is now made to FIG. 2 and FIGS. 3(a)-3(l) for description of the process for producing the construction depicted in FIG. 1. This method may be subdivided into four major fabrication steps, depicted into rows I-IV shown in FIG. 2. These steps, with their correspondence in FIG. 3, comprise polymer application in row I and FIGS. 3(a)-(b), slope bump formation in row II and FIGS. 3(c)-(g), over-the-edge metallization in row III and FIGS. 3(h)-(l), and indium bump lift-off in row IV.

For purposes of the present exposition, the beginning point of the processing begins with readout wafer 14 having metal pads 28 of aluminum, having a thickness of 1.5 μm, one of which is shown in FIG. 3(a) and a reticulated detector 12 having aluminum pads 24. A polymer layer 50 is applied to readout circuit 14 and its aluminum pads 28. A prefered polymer comprises polyimide. To form layer 50, a polyamic acid solution is spun onto the suface of circuit 14 and aluminum pads 28 in a thickness of about 5 μm, as set forth in substep A of the row I major step. The polyamic acid solution is then polymerized as indicated in substeps B and C, comprising an "A" stage cure at 130° C., with a checking of its thickness, followed by a "B" stage cure at 350° C. The thickness is again checked to insure that the resulting cured polymer denoted by indicium 50 in FIGS. 3(b)-(e), has an even 5 μm thick coat.

Once the proper polymer layer 50 has been formed on wafer 14 and its pad 28, polymer bumps are then formed from layer 50 as outlined in the major fabrication step of row II, substeps D-G, FIGS. 3(c)-(g). A layer of nickel 52 is first deposited in a thickness of 1000 Angstroms on the polymer layer, as illustrated in FIG. 3(c) and substep D of FIG. 2. Nickel is a preferred material because subsequent steps in the definition of the polymer bumps include the use of oxygen plasma etching. It is to be understood, however, that other materials which can act as a plasma mask may be utilized or, if other bump definition processes are used, then other suitable materials may be employed.

To form nickel layer 52 into mask, a photoresist 54 is placed on the nickel layer and processed to form a mask to enable portions of the unprotected nickel layer to be removed to define the configuration illustrated in FIG. 3(d). This patterning of the nickel to form a mask therefrom is accomplished by use of standard photolithographic techniques and acid etching or, alternatively, by any other standard lift-off process. These substeps are generally defined as substeps D and F of major step II of FIG. 2.

Figure 2:
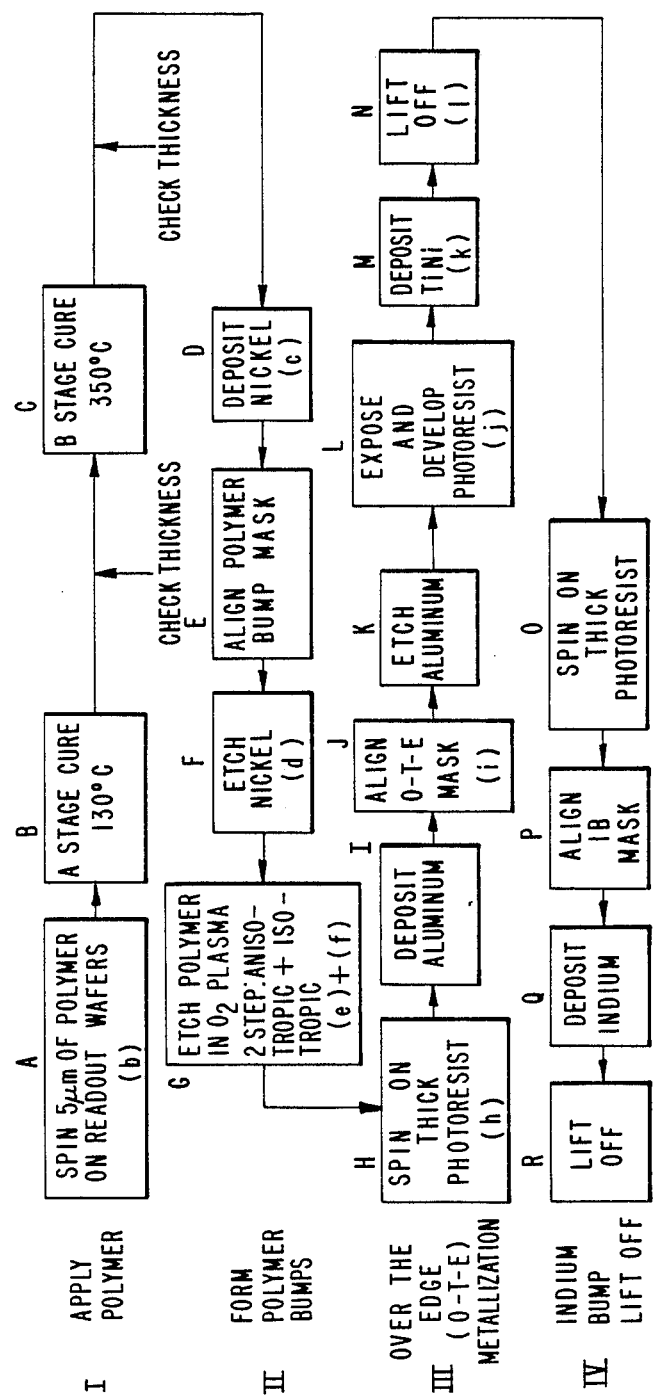
FIG. 2 is a diagramatic exposition of the processing steps for fabricating the construction illustrated in FIG. 1.
Figure 3:
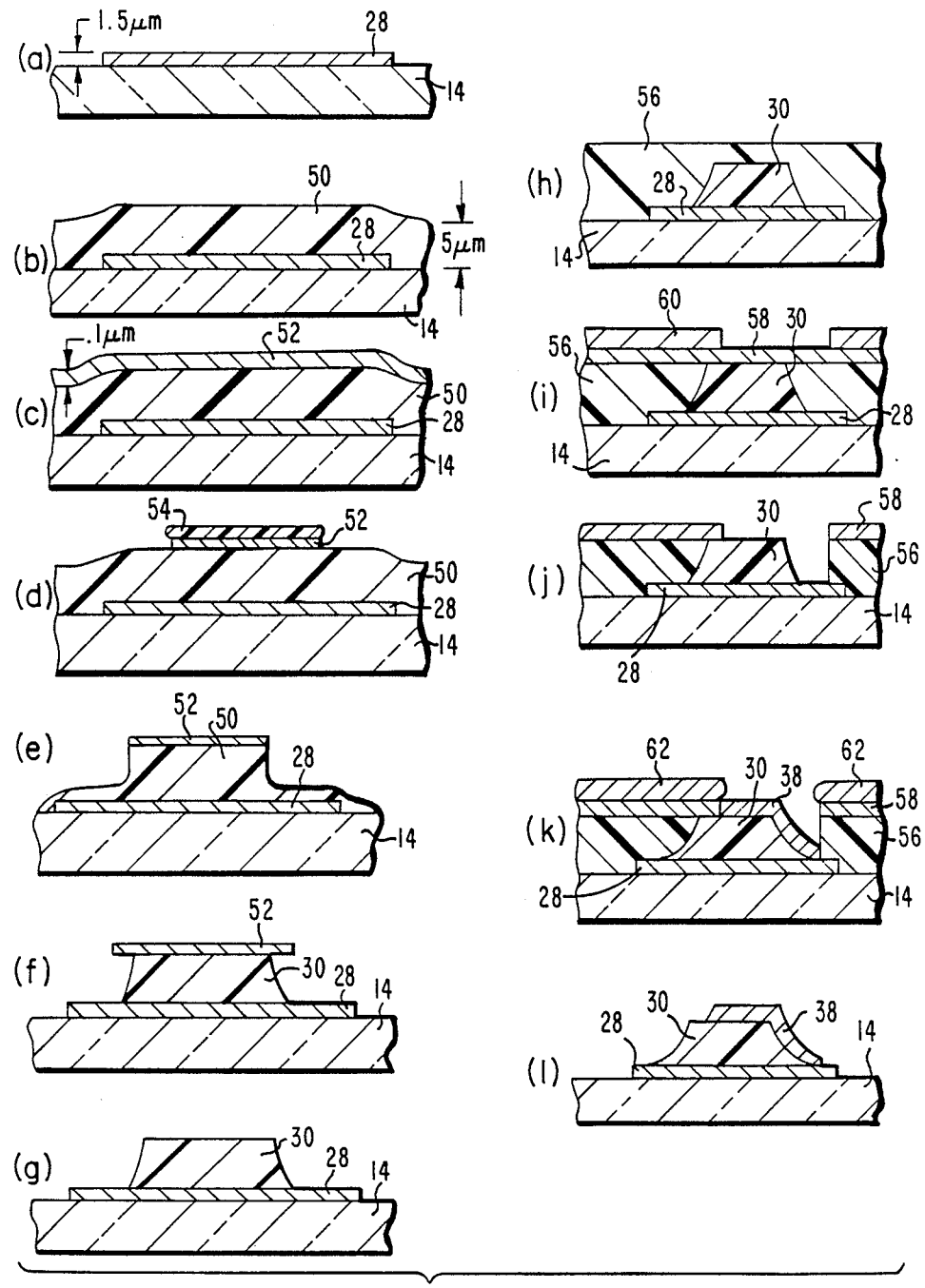
FIGS. 3(a) through 3(l) depict the several steps embodied in the process outlined in FIG. 2, for producing the construction shown in FIG. 1.

The definitization of the polymer layer into bumps 30 involve a two step plasma etching process, represented as substep G of FIG. 2 and shown in FIGS. 3(e)-3(g). This two-step oxygen plasma etching process is standard. First, the polymer is etched anisotropically in a parallel plate or RIE plasma system. This etch not only removes portions of polymer layer 50 not protected by nickel plasma mask 52 to form a configuration generally depicted in FIG. 3(e), but also removes resist mask 54. The first plasma etch is continued until approximately 80 percent of the thickness of the unprotected polymer layer is removed. In the second plasma etching step, the remaining unprotected polymer layer is removed, while at the same time, portions thereof are undercut beneath nickel plasma mask 52, as shown in FIG. 3(f) by utilizing an isotropic etch in a barrel-type plasma system. The etch end point is reached when metal input electrodes 28 of readout integrated circuit 14 are exposed. The nickel mask is then removed in a selective etching solution, which is selected not to attack the exposed aluminum, such as a 110° C. solution of Burmar 712D, which will etch the nickel mask in approximately 30 minutes. The resulting product, comprising polymer bump 30, is shown in FIG. 3(g), in readiness for application of metal contact 38.

Contact 38 over bump 30 is formed according to major step III of FIG. 2 and FIGS. 3(h)-(l). A photoresist 56 is thickly spun over wafer 14, pads 28 and polymer bumps 30, as shown in FIG. 3(h) and substep H. This photoresist is approximately 7 micrometers, and soft-baked. A layer of aluminum 58 of 1000 Angstroms thickness is then deposited over photoresist 56, substep I. An over-the-edge (O-T-E) mask 60, such as of titanium nickel, substep J, is then accurately placed over aluminum layer 58 as shown in FIG. 3(i), and the aluminum layer is appropriately etched (substep K). Mask 60 is then removed and the exposed resist from layer 56 is then exposed and developed and removed (substep L) to provide the configuration illustrated in FIG. 3(j).

The over-the-edge-metallization is then placed over the mask formed from aluminum layer 58 and within the thus formed opening in aluminum mask 58 and remaining photoresist 56, as illustrated in FIG. 3(k) and substep M. Placement of the metallization comprises a sputtering of approximately 1000 Angstroms of both titanium and nickel, to form contact 38.

Thereafter, as defined in substep N, all but the desired over-the-edge metallization, comprising contact 38, is removed by ultrasonic agitation of the workpiece in acetone, which disolves the photoresist and permits the mask from aluminum layer 58 and any sputtered metal 62, which is of the same composition as contact 38, to be floated away, thereby resulting in the plurality of polymer bumps 30 and metal contacts 38 on contact pads 28 of wafer 14.

The final major indium bump lift-off step IV requires a very thick coat of photoresist to be applied, because the indium bumps are positioned on top of the polymer bumps, 5 $\mu$m above the surface of wafer 14. Accordingly, a coat of approximately 13 $\mu$m of photoresist is preferred, preferably with a double spin-on process of first 10 $\mu$m and then 3 $\mu$m of photoresist, which is softbaked between the applications, and designated as substep O. A photolithographic mask is then aligned atop the photoresist (substep P) to provide openings within the photoresist. After removal of desired photoresist atop the area of metal contact 38 on top surface 34 of polymer bump 30, indium is evaporated approximately 3 $\mu$m thick (substep Q) to form contacts 44 illustrated in FIG. 1. Thereafter, the photoresist is removed (substep R) by ultrasonic agitation in acetone.

Pyroelectric detector 12 comprising chips 18 with aluminum contacts 24 is then processed to provide indium bumps 45 thereon so that indium bumps 45 on pyroelectric detector 12 will be able to be mated with indium bumps 44 on polymer bumps 30 and its metal contact portion 42.

Although the invention has been described with reference to particular embodiments thereof, it should be realized that various changes and modifications may be made therein without departing from the spirit and scope of the invention.

What is claimed is:

1. A thermally insulative and electrically conductive interconnection between means having first and second electric contracts, comprising:
    thermally and electrically insulative material positioned adjacent to the first contact;
    an electrically conductive interconnect, having first and second interconnect portions, adhered to the insulative material; and
    said first and second interconnect portions being electrically secured respectively to said first and second contacts.

2. An interconnection according to claim 1 in which said material is sloped at least where the interconnect is subsequently adhered thereto.

3. An interconnection according to claim 2 further including conductive material on the exposed second interconnect portion.

4. An interconnection according to claim 3 in which said conductive material on said second interconnect portion comprises indium.

5. An interconnection according to claim 4 in which the second interconnect portion is 5 $\mu$m above the first contact and the indium conductive material is 3 $\mu$m thick.

6. An interconnection according to claim 4 in which mating indium material is positioned on the second electric contact, and said two indium materials are bonded together to effect said electrically securing means.

7. An interconnection according to claim 4 in which said means having said first and second contacts respectively comprise a readout circuit and a pyroelectric detector focal plane array, each having a plurality of contact areas on which a plurality of said first and second contacts are respectively located, further including mating indium material placed respectively on said first and second electric contacts, said indium materials being together to effect said electrically securing means.

8. An interconnection according to claim 1 in which said insulative material is approximately 5 $\mu$m thick and said electrically conductive interconnect is approximately 1000 Angstroms thick.

9. An interconnection according to claim 1 in which said insulative material comprises a truncated pyramid.

10. A method for producing a thermally insulative and electrically conductive interconnection between means having first and second electric contacts, comprising the steps of:
    forming thermally and electrically insulative material adjacent to the first contact;
    adhering an electrically conductive interconnect, having first and second interconnect portions, to the insulative material; and
    electrically securing the first and second interconnect portions respectively to the first and second contacts.

11. A method according to claim 10 in which said forming step comprises the step of sloping the material at least where the interconnect is subsequently adhered thereto.

12. A method according to claim 11 in which said sloping step comprises the steps of anisotropically etching the material nearly to the first contact and thereafter isotropically etching the material in a barrel-type plasma system.

13. A method according to claim 12 in which said anisotropically etching step comprises the step of etching the material to approximately 80% of its thickness.

14. A method according to claim 13 in which said anisotropically etching step comprises the step of performing it in a parallel plate or RIE system.

15. A method according to claim 12 in which said anisotropically etching step comprises the step of performing it in a parallel plate or RIE system.

16. A method according to claim 11 wherein the material comprises a polymeric material initially applied over the first contact, and wherein said sloping step comprises the steps of:
    depositing a resist over the polymeric material, in which the resist comprises a material which is different from that of the first contact;
    aligning a mask over the resist;
    anisotropically etching the polymeric material to approximately 80% of its thickness; and
    thereafter isotropically etching the material in a barrel-type plasma system.

17. A method according to claim 16 in which said anisotropically etching step comrises the step of performing it in a parallel plate or RIE system.

18. A method according to claim 11 in which said adhering step comprises the steps of:
    applying a resist to the sloped material;

placing a second resist over the first resist, the second resist comprising matter which is different from the first resist;

removing portions of the second resist, while preventing removal of the first resist;

utilizing the second resist as a mask, removing portions of the first resist not protected by the second resist;

depositing conductive material to form the interconnect; and removing the first and the second resist.

19. A method according to claim 18 in which the conductive material of the interconnect comprises titanium and nickel.

20. A method according to claim 19 in which the first resist comprises a photoresist, and the second resist comprises aluminum.

21. A method according to claim 20 in which said first and second resist removing step comprises the step of removing the photoresist, thereby floating away the aluminum resist.

22. A method according to claim 18 in which said electrically securing step comprises the steps of:

applying a thick layer of photoresist over exposed portions of the interconnect, and first contact and the insulative material;

removing the photoresist from the second interconnect portion;

depositing a conductive material to the exposed second interconnect portion;

placing conductive material on the exposed second interconnect portion;

removing the photoresist; and coupling the second contact to the second interconnect portion.

23. A method according to claim 22 in which the conductive material on the exposed second interconnect portion comprises indium.

24. A method according to claim 23 in which said step of applying a thick layer of photoresist comprises the steps of coating about 13 μm of the photoresist in two applications.

25. A method according to claim 24 in which the second interconnect portion is 2 μm above the first contact and the indium conductive material is 3 μm thick.

26. A method according to claim 23 further comprising the steps of placing mating indium material on the second electric contact, and bonding the two indium materials together to effect said electrically securing step.

27. A method according to claim 11 wherein the means having the first and second contacts respectively comprise a readout circuit and a pyroelectric detector focal plane array, each having a plurality of contact areas on which a plurality of the first and second contacts are respectively located, further including the steps of placing mating indium material respectively on the first and second electric contacts, and bonding the two indium materials together to effect said electrically securing step.

* * * * *